US008543877B2

(12) United States Patent
Chen et al.

(10) Patent No.: US 8,543,877 B2
(45) Date of Patent: Sep. 24, 2013

(54) METHOD OF PERFORMING A CHIP BURN-IN SCANNING WITH INCREASED EFFICIENCY

(75) Inventors: Wei-Ju Chen, Taipei (TW); Shi-Huei Liu, Hsinchu County (TW); Lien-Sheng Yang, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 56 days.

(21) Appl. No.: 13/291,041

(22) Filed: Nov. 7, 2011

(65) Prior Publication Data

US 2012/0131398 A1 May 24, 2012

(30) Foreign Application Priority Data

Nov. 24, 2010 (TW) ............................... 99140510 A

(51) Int. Cl.
*G01R 31/28* (2006.01)

(52) U.S. Cl.
USPC .......................................................... 714/728

(58) Field of Classification Search
USPC .......................................................... 714/728
See application file for complete search history.

(56) References Cited

U.S. PATENT DOCUMENTS

| | | | | |
|---|---|---|---|---|
| 7,472,326 | B2 * | 12/2008 | Holmes | 714/738 |
| 8,001,439 | B2 * | 8/2011 | Ong | 714/742 |
| 8,069,378 | B2 * | 11/2011 | Zerbe et al. | 714/715 |
| 2005/0063230 | A1 * | 3/2005 | Seitoh | 365/201 |

* cited by examiner

*Primary Examiner* — Shelly A Chase
*Assistant Examiner* — Enam Ahmed
(74) *Attorney, Agent, or Firm* — Winston Hsu; Scott Margo

(57) ABSTRACT

Utilize a pattern generator to write a predetermined logic voltage to each memory cell of a memory chip. Read a predetermined logic voltage stored in the memory cell. Compare the predetermined logic voltage stored in the memory cell with the predetermined logic voltage to determine if the memory cell is a good memory cell or not and store a determination result corresponding to the memory cell in a data latch of the memory chip. And determine if the memory chip is a good memory chip or not according to determination results of all memory cells of the memory chip stored in the data latch of the memory chip.

11 Claims, 6 Drawing Sheets

METHOD OF PERFORMING A CHIP BURN-IN SCANNING WITH INCREASED EFFICIENCY

BACKGROUND OF THE INVENTION

1. Field of the Invention

The present invention is related to a method of chip burn-in scanning, and particularly to a method that utilizes a data latch of a chip to increase chip burn-in scanning efficiency.

2. Description of the Prior Art

Please refer to FIG. 1. FIG. 1 is a diagram illustrating chip burn-in scanning 100 according to the prior art. As shown in FIG. 1, a pattern generator 101 can write a predetermined logic voltage (a logic-high voltage "1" or a logic-low voltage "0") to each memory cell of a memory chip 102. The pattern generator 101 can utilize a solid pattern, a checkerboard pattern, a row bar pattern, and/or a column bar pattern to write the predetermined logic voltage to each memory cell of the memory chip 102.

In addition, as shown in FIG. 1, a pass/fail decision unit 104 determines whether a predetermined logic voltage stored in each memory cell of the memory chip 102 is correct, and outputs a determination result corresponding to each memory cell. Then, a test machine 108 reads the determination result corresponding to each memory cell. However, the test machine 108 does not discriminate which memory cell of the memory chip 102 is failed. As long as one memory cell of the memory chip 102 is failed, the test machine 108 determines the memory chip 102 to be failed. Because the chip burn-in scanning 100 spends too much time to determine whether the memory chip 102 is passing or not, the chip burn-in scanning 100 is inefficient for testing the memory chip 102.

SUMMARY OF THE INVENTION

An embodiment provides a method of performing chip burn-in scanning with increased efficiency. The method includes utilizing a pattern generator to write a predetermined logic voltage to each memory cell of a memory chip; reading a predetermined logic voltage stored in the memory cell; comparing the predetermined logic voltage stored in the memory cell with the predetermined logic voltage written by the pattern generator to determine whether the memory cell is passing or not, and storing a determination result corresponding to the memory cell in a data latch of the memory chip ; determining whether the memory chip is passing or not according to determination results of all memory cells of the memory chip stored in the data latch of the memory chip.

The present invention provides a method of performing chip burn-in scanning with increased efficiency. The method utilizes a data latch of a memory chip to store a determination result or a test result. The data latch only outputs a final logic operation result corresponding to the memory chip when the data latch receives a read signal from a test machine, instead of directly outputting the determination result or the test result corresponding to each memory cell. Thus, when the memory chip performs chip burn-in scanning or a chip probe test, because the data latch outputs the final logic operation result corresponding to the memory chip when the data latch receives the read signal from the test machine, the present invention can increase chip burn-in scanning efficiency and chip probe test efficiency.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
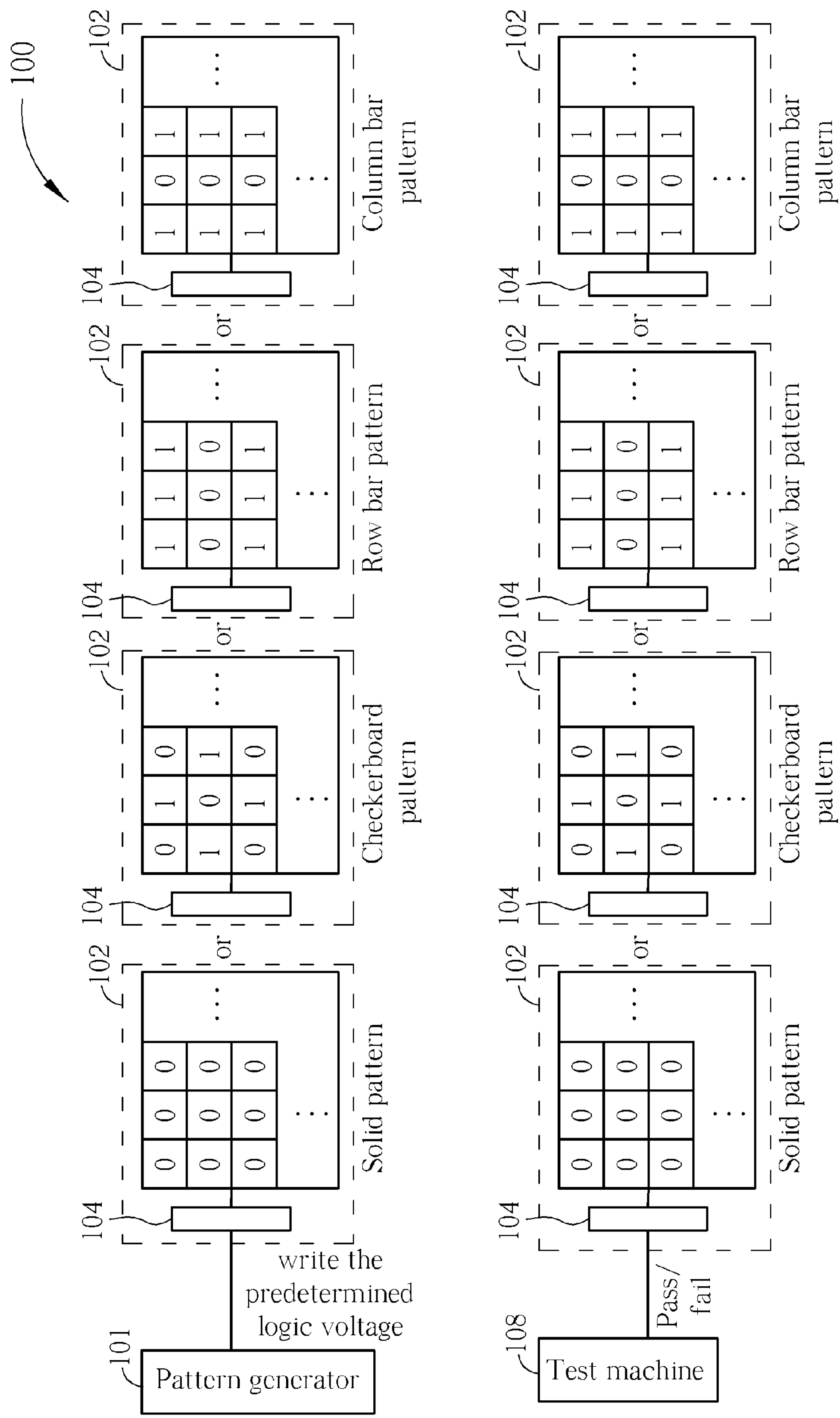
FIG. 1 is a diagram illustrating chip burn-in scanning according to the prior art.
Figure 2:
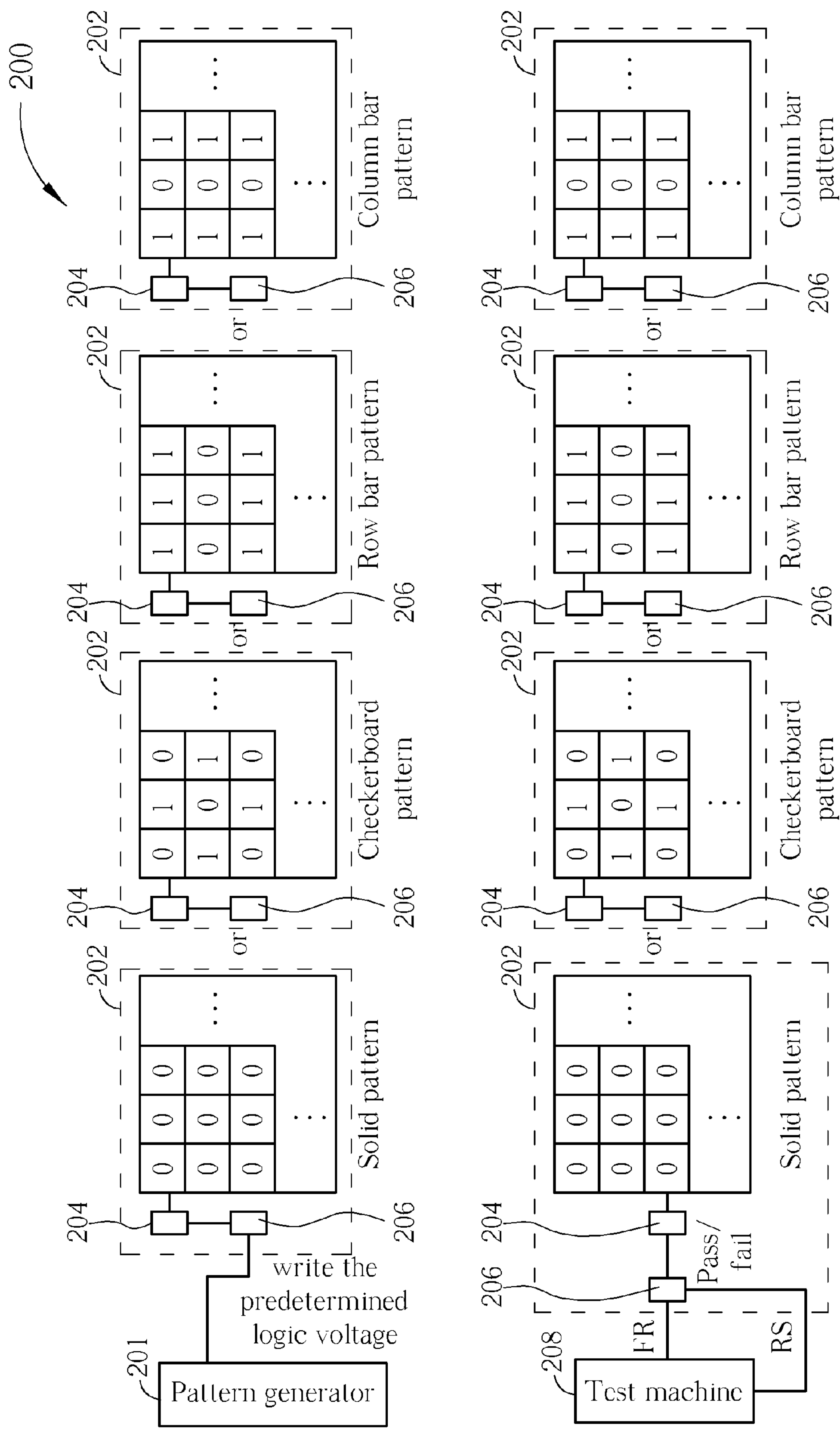
FIG. 2 is a diagram illustrating chip burn-in scanning with increased efficiency according to an embodiment.

Please refer to FIG. 2. FIG. 2 is a diagram illustrating chip burn-in scanning 200 with increased efficiency according to an embodiment. As shown in FIG. 2, a pattern generator 201 can write a predetermined logic voltage to each memory cell of a memory chip 202, where the predetermined logic voltage is a logic-high voltage "1" or a logic-low voltage "0" . The pattern generator 201 can utilize a solid pattern, a checkerboard pattern, a row bar pattern, and/or a column bar pattern to write the predetermined logic voltage to each memory cell of the memory chip 202. But, the present invention is not limited to the solid pattern, the checkerboard pattern, the row bar pattern, and the column bar pattern. In addition, as shown in FIG. 2, a pass/fail decision unit 204 compares a predetermined logic voltage stored in each memory cell with a predetermined logic voltage written by the pattern generator 201 to determine whether the memory cell passes or not, and stores a determination result in a data latch 206 of the memory chip 202. Compared to the prior art, the data latch 206 only outputs a final logic operation result FR corresponding to the memory chip 202 when the data latch 206 receives a read signal RS from a test machine 208. Then, the test machine 208 determines whether the memory chip 202 passes or not according to the read signal RS and the final logic operation result FR.

Figure 3:
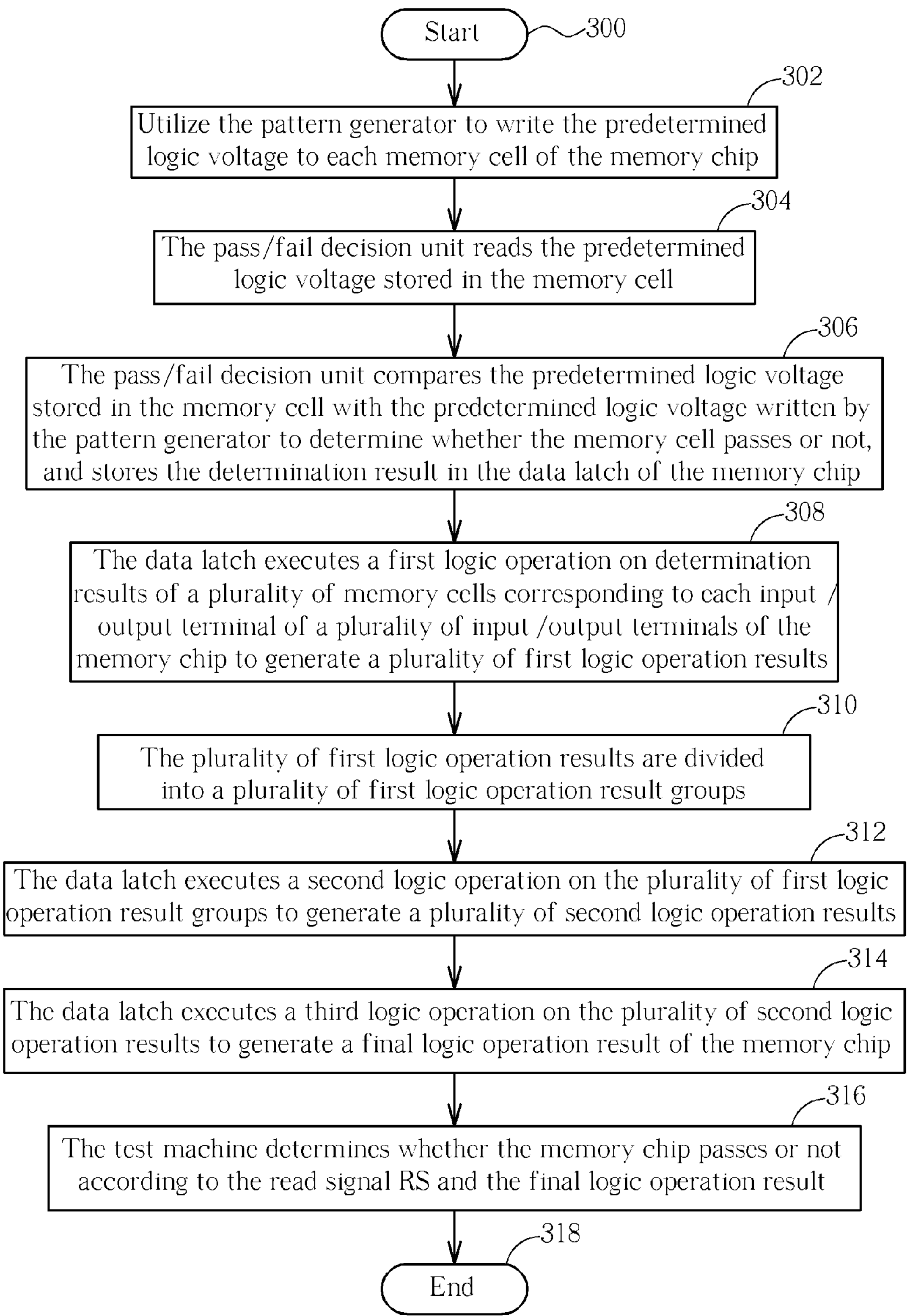
FIG. 3 is a flowchart illustrating a method of performing chip burn-in scanning with increased efficiency according to another embodiment.
Figure 4:
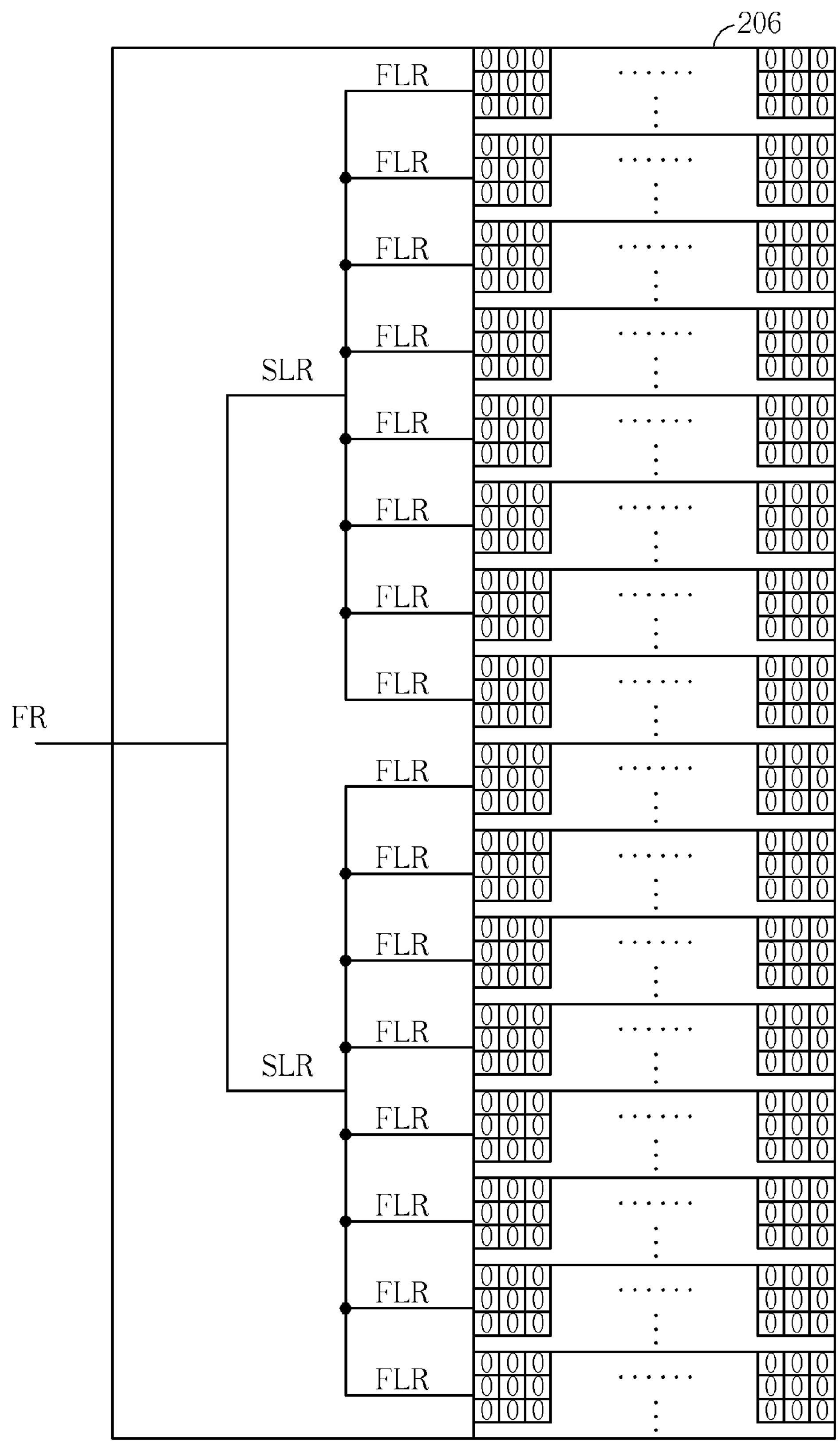
FIG. 4 is a diagram illustrating operation of the data latch according to the method in FIG. 3.

Please refer to FIG. 3 and FIG. 4. FIG. 3 is a flowchart illustrating a method of performing chip burn-in scanning with increased efficiency according to another embodiment, and FIG. 4 is a diagram illustrating operation of the data latch 206 according to the method in FIG. 3. Detailed steps are as follows:

Step 300: Start.

Step 302: Utilize the pattern generator 201 to write the predetermined logic voltage to each memory cell of the memory chip 202.

Step 304: The pass/fail decision unit 204 reads the predetermined logic voltage stored in the memory cell.

Step 306: The pass/fail decision unit 204 compares the predetermined logic voltage stored in the memory cell with the predetermined logic voltage written by the pattern generator 201 to determine whether the memory cell passes or not, and stores the determination result in the data latch 206 of the memory chip 202.

Step 308: The data latch 206 executes a first logic operation on determination results of a plurality of memory cells corresponding to each input/output terminal of a plurality of input/output terminals of the memory chip 202 to generate a plurality of first logic operation results FLR.

Step 310: The plurality of first logic operation results FLR are divided into a plurality of first logic operation result groups.

Step 312: The data latch 206 executes a second logic operation on the plurality of first logic operation result groups to generate a plurality of second logic operation results SLR.

Step 314: The data latch 206 executes a third logic operation on the plurality of second logic operation results SLR to generate a final logic operation result FR of the memory chip 202.

Step 316: The test machine 208 determines whether the memory chip 202 passes or not according to the read signal RS and the final logic operation result FR.

Step 318: End.

In Step 302, the pattern generator 201 can utilize the solid pattern, the checkerboard pattern, the row bar pattern, and/or the column bar pattern to write the predetermined logic voltage to each memory cell of the memory chip 202. In Step 306, the pass/fail decision unit 204 compares the predetermined logic voltage stored in the memory cell with the predetermined logic voltage written by the pattern generator 201 to determine whether the memory cell is passing or not. The pass/fail decision unit 204 stores the determination result in the data latch 206 of the memory chip 202, instead of directly outputting the determination result of the memory cell to the test machine 208, where the determination result is the logic-high voltage "1" or the logic-low voltage "0". As shown in FIG. 3, in Step 308, the data latch 206 executes the first logic operation (such as an "AND" logic operation) on the determination results of the plurality of memory cells corresponding to each input/output terminal of the plurality of input/output terminals of the memory chip 202 to generate the plurality of first logic operation results FLR. For example, the memory chip 202 has 16 input/output terminals (as shown in FIG. 4), so 16 first logic operation results FLR are generated in Step 308. But, the present invention is not limited to the memory chip 202 having the 16 input/output terminals. In Step 310, the data latch 206 divides the 16 first logic operation results FLR into 2 first logic operation result groups. But, the present invention is not limited to the 2 first logic operation result groups. In Step 312, the data latch 206 executes the second logic operation (such as an "AND" logic operation) on the 2 first logic operation result groups to generate 2 second logic operation results SLR (as shown in FIG. 4). In Step 314, the data latch 206 executes the third logic operation (such as an "AND" logic operation) on the 2 second logic operation results SLR to generate the final logic operation result FR (as shown in FIG. 4) of the memory chip 202. In Step 316, the data latch 206 only outputs the final logic operation result FR corresponding to the memory chip 202 when the data latch 206 receives the read signal RS from the test machine 208. The test machine 208 determines whether the memory chip 202 passes or not according to the read signal RS and the final logic operation result FR.

Figure 5:
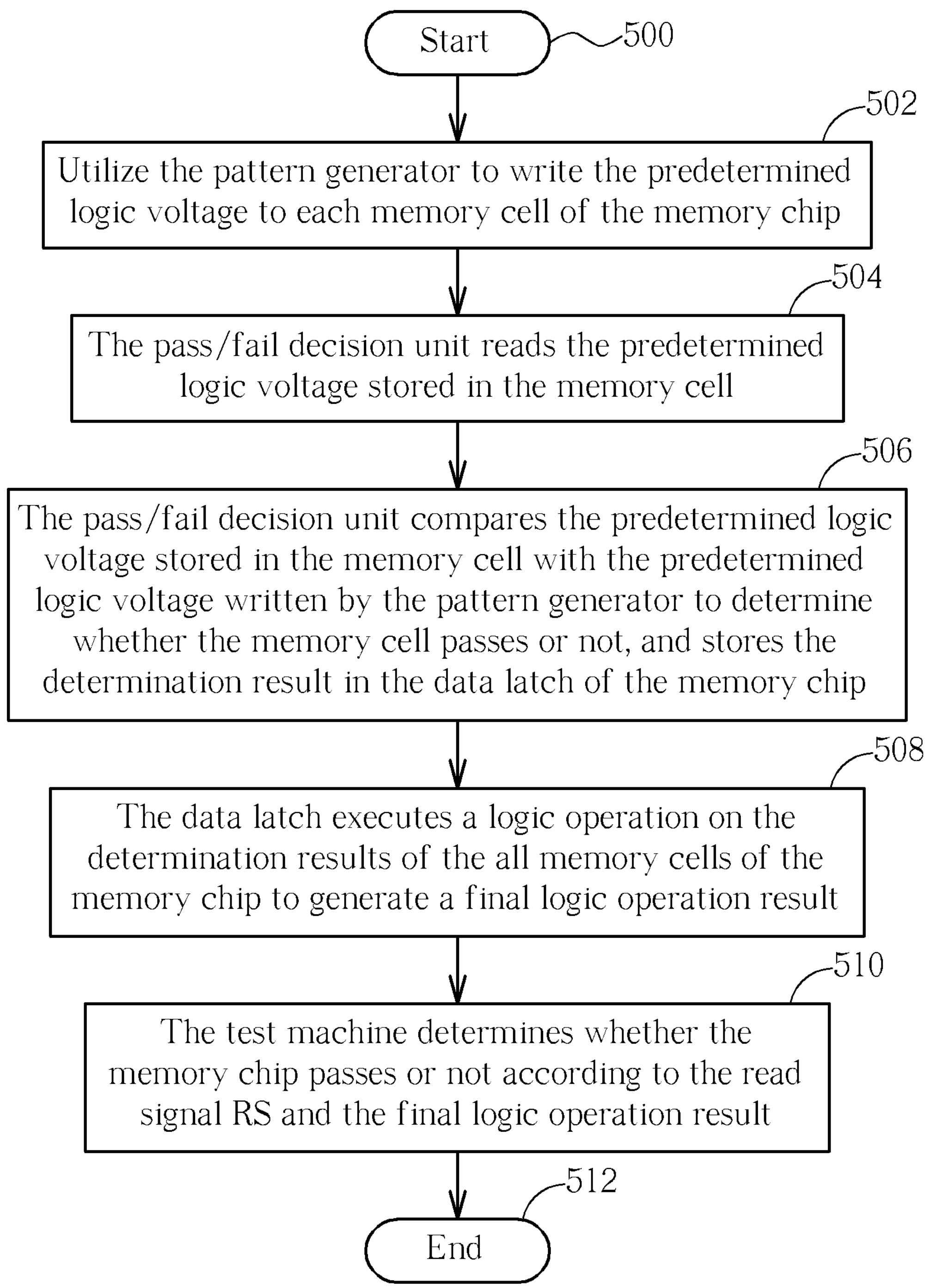
FIG. 5 is a flowchart illustrating a method of performing chip burn-in scanning with increased efficiency according to another embodiment.

Please refer to FIG. 5. FIG. 5 is a flowchart illustrating a method of performing chip burn-in scanning with increased efficiency according to another embodiment. Detailed steps are as follows:

Step 500: Start.

Step 502: Utilize the pattern generator 201 to write the predetermined logic voltage to each memory cell of the memory chip 202.

Step 504: The pass/fail decision unit 204 reads the predetermined logic voltage stored in the memory cell.

Step 506: The pass/fail decision unit 204 compares the predetermined logic voltage stored in the memory cell with the predetermined logic voltage written by the pattern generator 201 to determine whether the memory cell passes or not, and stores the determination result in the data latch 206 of the memory chip 202.

Step 508: The data latch 206 executes a logic operation on the determination results of the all memory cells of the memory chip 202 to generate a final logic operation result FR.

Step 510: The test machine 208 determines whether the memory chip 202 passes or not according to the read signal RS and the final logic operation result FR.

Step 512: End.

In Step 508, the data latch 206 executes the logic operation (such as an "AND" logic operation) on the determination results of all memory cells of the memory chip 202 to generate the final logic operation result FR once. In Step 510, only the final logic operation result FR corresponding to the memory chip 202 is outputted when the data latch 206 receives the read signal RS from the test machine 208. The test machine 208 determines whether the memory chip 202 passes or not according to the read signal RS and the final logic operation result FR.

Figure 6:
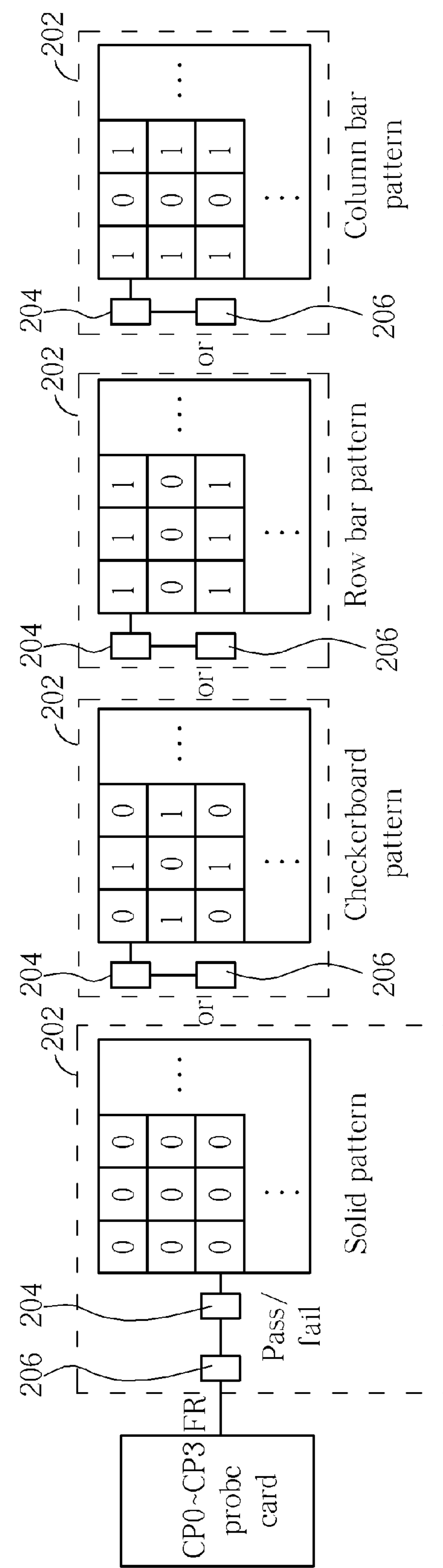
FIG. 6 is a diagram illustrating the chip probe test according to another embodiment.

In addition, the methods in FIG. 3 and FIG. 5 can also be applied to a chip probe test. Please refer to FIG. 6. FIG. 6 is a diagram illustrating the chip probe test according to another embodiment. As shown in FIG. 6, when utilizing a low speed probe card (such as CP0-CP3 probe cards) to perform the chip probe test, a test result corresponding to each memory cell of the memory chip 202 is first stored in the data latch 206. Then, the data latch 206 executes a logic operation on the test result corresponding to each memory cell of the memory chip 202 according to the methods in FIG. 3 and FIG. 5 to generate a final logic operation result FR. When the low speed probe card transmits a read signal RS, the low speed probe card determines whether the memory chip 202 passes or not according to the read signal RS and the final logic operation result FR.

To sum up, the method of performing the chip burn-in scanning with increased efficiency utilizes the data latch of the memory chip to store the determination result or the test result. The data latch only outputs the final logic operation result corresponding to the memory chip when the data latch receives the read signal from the test machine, instead of directly outputting the determination result or the test result corresponding to each memory cell. Thus, when the memory chip performs the chip burn-in scanning or the chip probe test, because the data latch outputs the final logic operation result corresponding to the memory chip when the data latch receives the read signal from the test machine, the present invention can increase the chip burn-in scanning efficiency and chip probe test efficiency.

Those skilled in the art will readily observe that numerous modifications and alterations of the device and method may be made while retaining the teachings of the invention.

What is claimed is:

1. A method of performing chip burn-in scanning with increased efficiency, the method comprising:

utilizing a pattern generator to write a predetermined logic voltage to a plurality of memory cells of a memory chip;

reading a predetermined logic voltage stored in the plurality of memory cells;

comparing the predetermined logic voltage stored in the plurality of memory cells with the predetermined logic voltage written by the pattern generator to determine whether the plurality of memory cells are passing or not, and storing a plurality of determination results corresponding to the plurality of memory cells in a data latch of the memory chip;

executing at least one logic operation on the plurality of determination results stored in the data latch of the memory chip to generate a final logic operation result of the memory chip; and determining whether the memory chip passes or not according to the final logic operation result and a read signal generated from a test machine.

2. The method of claim 1, wherein the pattern generator utilizes a solid pattern to write the predetermined logic voltage to the plurality of memory cells of the memory chip.

3. The method of claim 1, wherein the pattern generator utilizes a checkerboard pattern to write the predetermined logic voltage to the plurality of memory cells of the memory chip.

4. The method of claim 1, wherein the pattern generator utilizes a row bar pattern to write the predetermined logic voltage to the plurality of memory cells of the memory chip.

5. The method of claim 1, wherein the pattern generator utilizes a column bar pattern to write the predetermined logic voltage to the plurality of memory cells of the memory chip.

6. The method of claim 1, wherein executing the at least one logic operation on the plurality of determination results stored in the data latch of the memory chip to generate the final logic operation result comprises:

executing a first logic operation on the plurality of determination results of the plurality of memory cells corresponding to each input/output terminal of a plurality of input/output terminals of the memory chip to generate a plurality of first logic operation results;

dividing the plurality of first logic operation results into a plurality of first logic operation result groups;

executing a second logic operation on the plurality of first logic operation result groups to generate a plurality of second logic operation results; and executing a third logic operation on the plurality of second logic operation results to generate the final logic operation result of the memory chip.

7. The method of claim 6, wherein the first logic operation, the second logic operation, or the third logic operation is an "AND" logic operation.

8. The method of claim 1, wherein executing the at least one logic operation on the plurality of determination results stored in the data latch of the memory chip to generate the final logic operation result comprises:

executing a predetermined logic operation on the plurality of determination results to generate the final logic operation result.

9. The method of claim 8, wherein the predetermined logic operation is an "AND" logic operation.

10. The method of claim 1, wherein the predetermined logic voltage is a logic-high voltage.

11. The method of claim 1, wherein the predetermined logic voltage is a logic-low voltage.

* * * * *